United States Patent
Dang et al.

(10) Patent No.: US 7,741,834 B2
(45) Date of Patent: Jun. 22, 2010

(54) METHOD TO MONITOR SUBSTRATE VIABILITY BY A SENSOR MOUNTED TO A SUBSTRATE

(75) Inventors: Hien Dang, Nanuet, NY (US); Sri Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 11/835,008

(22) Filed: Aug. 7, 2007

(65) Prior Publication Data
US 2009/0039911 A1    Feb. 12, 2009

(51) Int. Cl.
*G01R 31/26* (2006.01)
(52) U.S. Cl. .................... 324/158.1; 324/765
(58) Field of Classification Search ........... None
See application file for complete search history.

(56) References Cited

U.S. PATENT DOCUMENTS

| | | | | |
|---|---|---|---|---|
| 5,070,296 | A * | 12/1991 | Priebe | 324/73.1 |
| 5,606,264 | A * | 2/1997 | Licari et al. | 324/763 |
| 6,407,569 | B1 * | 6/2002 | Boettler et al. | 324/763 |
| 6,734,693 | B2 * | 5/2004 | Nakayama | 324/763 |
| 2005/0086021 | A1 * | 4/2005 | Khandros et al. | 702/121 |

OTHER PUBLICATIONS

Rao R. Tummala et al., Semiconductor Packaging, Microelectronics Packaging Handbook, 1997, 34-36.
S.L. Buchwalter et al., Effects of mechanical stress and moisture on packaging interfaces, 663-675 vol. 49 No. 4/5 Jul./Sep. 2005.
E.D. Blackshear et al., The evolution of build-up package technology and its design challenges, 641-661 vol. 49 No. 4/5 Jul./Sep. 2005.

* cited by examiner

*Primary Examiner*—Vinh P Nguyen
(74) *Attorney, Agent, or Firm*—Daniel P. Morris (57) ABSTRACT

Method for detecting and reporting a condition. The components of the invention include an electronic package having a substrate with electrically conducting lines electrically connected to an integrated chip, and to a source of voltage. The integrated circuit chip is mounted onto a substrate and electrically connected to at least one electrically conducting line. A sensor, combined with a signal generator, connected to the substrate, is operable to generate an electrical signal upon detection of a condition selected from a condition of the substrate and a condition of an electrical connection to the substrate. The signal generator, after immediately receiving the aforesaid electrical signal from the sensor, emits the warning signal. The warning signal of indicated of an existing defect or a condition which can lower the longevity of the total electronic package.

5 Claims, 5 Drawing Sheets

METHOD TO MONITOR SUBSTRATE VIABILITY BY A SENSOR MOUNTED TO A SUBSTRATE

BACKGROUND OF THE INVENTION

1. Field of the Invention

This invention relates to a method of detecting and reporting a condition associated with a substrate having an integrated circuit chip mounted thereto.

2. Description of Prior Art

Currently, the condition of such substrates is assessed only once, at the time that the substrate and chip have been joined together and are being readied for shipment as a complete electronic package. If the package then meets requirements, no further monitoring is done of its condition. Clearly, it would be desirable to be warned of any deterioration of its condition after the electronic package is put into service. See, for example S. L. Buchwalter et al., "Effect of Mechanical Stress and Moisture On Packaging Interfaces", IBM Journal of Research and Development, Vol. 49, July 2005 which outlines some of the reliability problems faced with electronic packages, especially where two surfaces meet.

Moreover, after such substrate-chip package is put into service in a computer product, it then undergoes stresses that have not been experienced during its production. As will be understood it would be desirable to monitor the effects of such stresses on the condition of the electronic package during its operation.

As is well known, such substrates may comprise various materials, such as organic and in organic. See, E. D. Blackshear et al., "The evolution of Build-Up Package Technology and Its Design Challenges", IBM Journal of Research and Development, Vol. 49, July 2005 for a paper on organic packages, Examples of inorganic include ceramic such as glass-ceramic and Alumina. Electronic packages are assembled from substrates, integrated circuit chips, passive components and a printed circuit board (PCB). They are stress tested to predict field life. The actual packages tested are specially designed and built to be tested under specific stress conditions. An example of a test would be where a package is powered up and powered down until it fails. The tools and testers designed are custom built to accommodate these specially designed test packages. These test packages are non-production hardware designed for the sole purpose of the stress tests. Data gathered from these tests are used by a statistical model that predicts time to failure. Essentially these models and data are used to predict field life. See, for example, *Microelectronic Packaging Handbook, Semiconductor Packaging* Part II, second edition, edited by Rao R. Tummala, Copyright 1997, Kluwer Academic Publisher, pages II-35-II-36.

The flaws in this methodology are, a) the mechanism of failure in the field may not be represented by the stress test. Sometimes the mechanism the test is designed for does not occur in the field, b) the sample sizes required to accurately predict the life time in the field are not large enough due to the expense associated with conducting the tests, c) certain test have been around so long and are so firmly established, they must be run as defined even if more recent knowledge renders them obsolete, and d) it is difficult in many of the stress test to determine exactly when the failure occurred.

The key flaw is actual production hardware is almost never stressed in some of the key stress tests. The way in which production packages are built, the shipping environment they are exposed to, and the process chemicals they are exposed to can make production hardware different than specialized electronic packaging for stressing.

Clearly if one could assess the life of actual production packages in the field it would better to measure field life to measure with the one time specialized tests currently employed.

Many electronic packaging applications are changing to use organic substrates, also referred to as an organic laminate package or simply an organic chip carrier. Organic substrates have high electrical conductivity, low inductance connections to reduce switching noise, and a low dielectric constant insulator to better match printed circuit board impedance. Most importantly the organic substrate has lower cost.

Some of the disadvantages of organic substrates are higher coefficient of thermal expansion (CTE) compared to the silicon chip mounted on the organic substrate and sensitivity to atmospheric humidity. Organic substrates have a CTE of 18 ppm which is much higher than that of Silicon (CTE~3 ppm). The CTE mismatch leads to higher dimensional distortion, to more stress on the chip, and to more stress on solder joint interconnections of the semiconductor chip to the organic substrate. Undesirable strain resulting from the stress can reduce the life of the substrate. With the introduction of lead free solder, the substrate is exposed to even higher reflow temperature of about 220° C. compared to reflow temperatures of lead/tin solder interconnections. This is a problem because physical properties of the material deteriorate above the glass transition temperature (Tg) of the organic material portion of the organic substrate. Above Tg the organic material may warp. The critical temperature for warpage may be between 120-180° C. for these organic materials. Even below Tg, the combination of mechanical stress and humidity work together to weaken the adhesive interface.

The organic substrate itself is quite complex. It may be composed of over 10 copper layers, laminated with layers of organic resin filled glass fiber. The copper layers are etched into several thousand electrically conducting lines in many different orientations. The resin layers may contain a non-uniform distribution of plated thru holes (PTH). This anisotropic metal loading on the layers can be a contributor to the degradation of field like when exposed to the aforesaid stresses. With constant introduction of new materials, new manufacturing processes, and diverse operating conditions, the reliability data gathered by a one time reliability assessment with non-product test vehicle substrates is unable to predict failure conditions occurring in real time. Having a more predictive assessment of field life would be highly desirable. Current methods of assessment are not doing a good job predicting when a production organic electronic package will fail.

Moreover, ceramic substrates also suffer from similar shortcomings that could be remedied by in-situ reliability assessment. There is a TCE mismatch between the printed wiring board material, also known as the printed circuit board (PCB), connected to the ceramic substrate and the ceramic substrate itself. As I/O counts increase (number of solder connections and distance of the connection furthest from the center) the distance from neutral point drives stress in the outer solder ball connections during thermal and power cycling in the field. The key solution to this problem is to be able to predict the actual life time in the field for individuals of a given product design and production lot under actual field conditions.

SUMMARY OF THE INVENTION

The present invention broadly and generally provides a method for detecting and reporting a condition, the aforesaid method comprising, a) a substrate comprising an electrically conducting line operable for electrically connecting to an integrated circuit chip, and to a source of voltage, b) the aforesaid integrated circuit chip being mounted to the aforesaid substrate and electrically connected to the aforesaid electrically conducting line, c) a sensor mounted to aforesaid substrate, the aforesaid sensor being operable to generate an electrical signal upon detection of a condition selected from a condition of the aforesaid substrate and a condition of an electrical connection to the aforesaid substrate and d) a signal generating device operable to receive the aforesaid electrical signal and, upon receipt thereof, operable to emit a warning signal.

According to a preferred embodiment of the invention, the aforesaid substrate is selected from the list of carrier types including a multi chip ceramic chip carrier, a single chip ceramic chip carrier, an organic multi chip carrier, an organic single chip carrier and silicon chip scale package.

According to another preferred embodiment of the invention, the aforesaid sensor is a strain gauge operable to detect strain conditions in said substrate.

According to another preferred embodiment of the invention the aforesaid condition of the aforesaid substrate comprises an electrical discontinuity in the aforesaid electrically conducting line.

According to another preferred embodiment of the invention, the aforesaid condition of an electrical connection to the aforesaid substrate is selected from a condition of a solder connection between the aforesaid integrated circuit chip and the aforesaid substrate and a solder connection between the aforesaid substrate and a printed circuit board.

According to another preferred embodiment of the invention, the aforesaid substrate comprises a plurality of electrical conducting lines wherein the aforesaid sensor is operable to detect electrical shorting between electrically conducting lines.

According to another preferred embodiment of the invention, the aforesaid sensor is operable to detect a thermal condition of the aforesaid substrate.

According to another preferred embodiment of the invention, the aforesaid sensor and aforesaid signal generating device are combined into a single integrated circuit device mounted on aforesaid substrate.

According to another preferred embodiment of the invention, the aforesaid signal generating device forms part of aforesaid integrated circuit chip.

According to another preferred embodiment of the invention, the aforesaid warning signal is sent by the aforesaid signal generating device immediately upon receipt of the aforesaid electrical signal by the aforesaid signal generating device.

The present invention provides a method for detecting and reporting a condition, comprising the steps of, a) providing a substrate that comprises an electrically conducting line, b) mounting an integrated circuit chip to the aforesaid substrate with electrical connection of the aforesaid integrated circuit chip to said line, c) mounting a sensor to the aforesaid substrate, the aforesaid sensor being operable to generate an electrical signal upon detection of a condition selected from a condition of the aforesaid substrate and a condition of an electrical connection to the aforesaid substrate, d) connecting a signal generator device to the aforesaid sensor, the aforesaid signal generating device being operable to receive the aforesaid electrical signal and, upon receipt thereof, operable to emit the aforesaid warning signal.

According to another preferred embodiment, the emitting of the aforesaid warning signal in step (d) is carried out wirelessly.

According to another preferred embodiment, the aforesaid warning signal is sent by an emitter immediately upon receipt of the aforesaid electrical signal by the aforesaid signal generating device.

According to another preferred embodiment, the aforesaid warning signal is received by the aforesaid integrated circuit chip as input to determine longevity of the aforesaid substrate.

According to another preferred embodiment, the aforesaid input is operable to determine the aforesaid longevity of an electrical connection to the aforesaid substrate.

DESCRIPTION OF THE PREFERRED EMBODIMENT

The present invention is directed toward a method to immediately detect a condition of a production substrate or electronic package, to transmit data representing the condition, and to report the condition immediately. The warning signal emitted is a report of a condition. The remaining lifetime of the substrate and its associated electrical connections could then be determined at that instant. Either the warning signal or the remaining field life could be sent to a display for the purpose of communicating the aforesaid conditions to the outside so action could be taken. Further described are the structures and the assembly of components necessary to carry out the method of detecting and reporting a warning signal indicative of the condition of a substrate.

In one embodiment the sensor is placed as a discrete component, mounted on the substrate. In that case, the signal generating device 6b can be located in a portion of an integrated circuit component mounted on the substrate. Additionally, the portion 6b of the sensor could also be located in any location in or on the substrate or at any other location associated with the electronic package. The logical location of the sensor will depend on substrate design, material and layout.

By the way of example, the sensor may be electrically connected to a circuit within or on the substrate that is operable to detect electrical opens, electrical shorts, over temperature conditions, conditions of strain leading to a warped substrate and conditions resulting from ionizing radiation such as alpha particles. Any one of these conditions can lower the reliability of the substrate and its electrical connections to the printed circuit board or to any other component (e.g. a resistor, capacitor, or integrated circuit chip). One skilled in the art would appreciate that the sensor could be applied to the detection of any number of conditions operable to degrade the field life of an electronic package or substrate.

The present invention is effective in sensing conditions which degrade the reliability. Reliability in this context is the time to failure or cycles to failure, or any measure of a condition that degrades the life of an electronic package while the package is in service. Conditions are generally of the substrate, of electrical connections and of components mounted to substrate surface electrical features and features internal to the substrate. Such conditions also include the internal power and ground planes, layer to layer via connections, in plane wiring, plate through holes, copper core, C4 connections, Land Grid Array connections, Ball Grid Array connections, Column Grid Array connections, wire bond connections, thin film wiring, build up layers, buried passive components, passive components mounted on the substrate and under chip encapsulatants structures.

Figure 1:
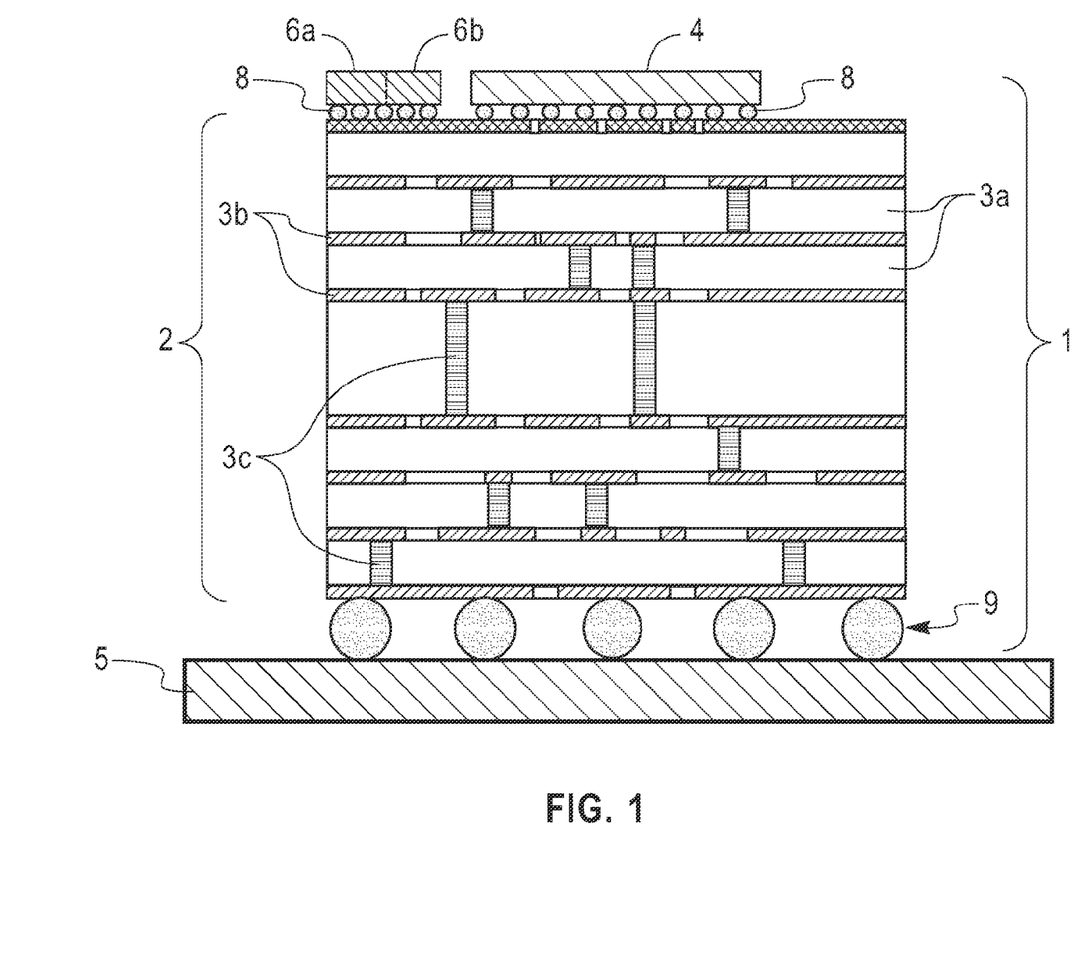
FIG. 1 is a schematic cross sectional view of an apparatus in accordance with an embodiment of the invention.

FIG. 1 shows a cross section of an inventive apparatus 1 in the form of an organic electronic package. Apparatus 1 includes a typical organic substrate 2 which comprises a dielectric material 3a and at least one electrically conducting line in the form of internal wiring 3b and PTH 3c. The line 3b functions to distribute power, ground and signals to and from the integrated circuit chip 4. Voltage from a power supply is provided to the substrate 2 and integrated circuit chip 4 by the printed circuit board (5) via connections (e.g. solder balls) to the substrate (2).

Substrates 2 comprised of various other materials, such as alumina, glass-ceramic, silicon, and silicon germanium may be used instead of organic material.

Electrical connection from integrated circuit chip 4 to the organic substrate 2 is by Controlled Collapse Chip Connections (C4) 8, also referred to as flip chip connections. Electrical connection is made from the organic substrate 2 to the printed circuit board 5 via solder balls 9. The sensor 6a is shown in FIG. to be mounted on the substrate 2. The signal generating device 6b is combined with the sensor 6a into a single integrated circuit device.

Figure 2:
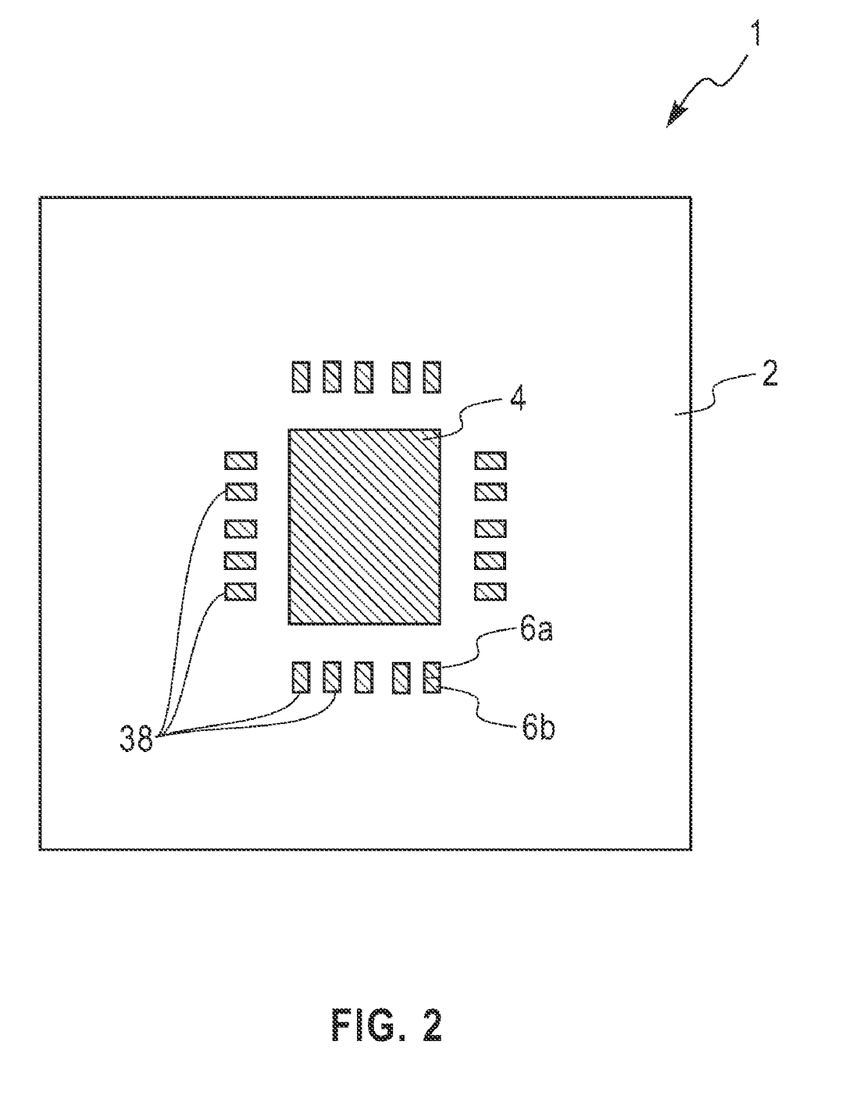
FIG. 2 is a schematic plan view of the apparatus of FIG. 1.

FIG. 2 shows apparatus 1 in a plan view. Apparatus 1 comprises substrate 2, integrated circuit chip 4, decoupling capacitors (38) and a simple integrated circuit device that comprises both sensor 6a and signal generating device 6b mounted on the top surface of the substrate 2. Alternatively, a sensor 6a could be used to sense the electrical connections to integrated circuit chip 4 and electrical connections to the printed circuit board 5. The signal generating device 6b, on receiving the electrical signal from the sensor 6a, is operable to generate a signal, warning of the aforesaid condition. In this embodiment the sensor 6a and the signal generating device 6b are combined into a single integrated circuit device mounted on the substrate 2.

In another embodiment, the sensor 6a may be is mounted in any location other than the top surface. Further, the signal generating device 6b, still in electrical communication with the sensor 6b may be mounted in any location other than the top surface of the substrate 2. One skilled in the art would recognize that the positions of the sensor 6a and the signal generating device 6b will be placed in any location logical for any specific design layout. In one embodiment the sensor 6a, the signal generating device 6b or both could occupy a site normally reserved for decoupling capacitors 38.

Therefore, in FIG. 2 the sensor 6a and the signal generating device 6b occupy a surface mount site normally reserved for decoupling capacitors 38. Alternatively, the functions provided by the signal generating device 6b may be provided by a portion of the integrated circuit chip 4 mounted on the substrate 2. Clearly, in a number of embodiments the sensor 6a and signal generating device 6b could be located in any other location logical to the design layout. Electrical communication between them could be wireless or by wire.

Figure 3:
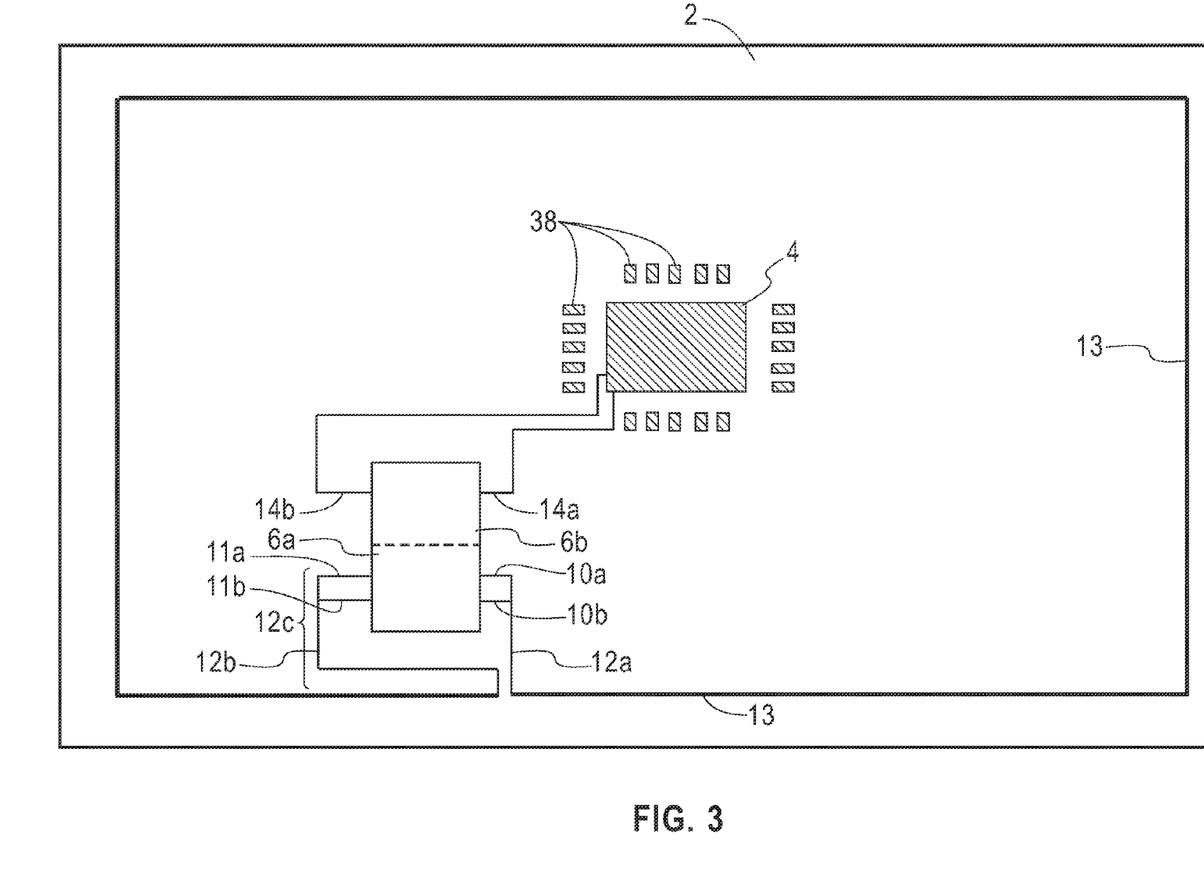
FIG. 3 is a schematic plan view of the apparatus of FIG. 2, with the sensor and signal generating device shown in greater detail.

FIG. 3 depicts a schematic plan view of an embodiment of the invention to immediately detect a condition of an electrically conducting line 13 of the substrate 2. The sensor 12c is composed a portion 6a, line 10a, line 10b, line 11a, line 11b, line 12a and line 12b. Sensor portion 6a of sensor 12c sends an electrical signal to the signal generating device 6b upon detection of a condition in line 13. The signal generating device 6b then emits a warning signal, warning of the condition of the line 13. In FIG. 3 the sensor 12c, including portion 6a, is separated from the signal generating device 6b by a dotted line, creating a sensor 12c and a signal generating device 6b at approximately the same design location.

The sensor 12c includes the portion 6a and a line 10a from the portion 6a to line 12a and line 12a to line 13. Another line 10b from portion 6a is also connected to line 12a. Then line 12a is connected to the line 13. A return connection from substrate line 13 is from the line 12b to return line 11a and to return line 11b. Line 11a and line 11b return to portion 6a of sensor 12c. The line 13 could be on one layer or it could weave across many lines on many layers of the substrate with the use of plated through holes (PTH) connections or any via connections. The lines could be Cu or any electrically conductive material selected from an element or combination of elements from the periodic table. Diamond, carbon nanotubes, and nanowires are a few examples of materials that could form the aforesaid lines and vias. The sensor 12c is constructed as a 4-point probe electrical design as shown in FIG. 3 or it may be constructed as a two point probe configuration.

Once a condition is detected by the sensor 12c, the portion 6a send an electrical signal based upon the aforesaid condition to the signal generating device 6b. The electrical signal contains data detected instantaneously by the sensor 12c during the service life of the electronic package 1. As will be understood, the signal generating device 6b may then send its warning signal by cable, data bus or wirelessly, to a monitor station for further action. Moreover, the warning signal could simply be a blinking light activated by the signal generating device 6b. The warning signal sent by the signal generating device 6b is a specific, immediate detection of a condition of the line 13.

The signal generating device 6b, in FIG. 3 is electrically connected to both the portion 6a of sensor 12c, and the integrated circuit chip 4. Connection of the signal generating device 6a to the integrated circuit chip 4 is from line 14a from the signal generator 6b to the integrated circuit chip 4. The circuit is completed by line 14b from the integrated circuit chip 4 back to the signal generator 6b. FIG. 3 shows this embodiment where the warning signal emitted by the signal generating device 6b is sent to the integrated circuit chip 4, to be stored in memory, retransmitted onward, further processed, or sent to a display device.

As one alternative to the structure of FIG. 3, the signal generating device 6b may be separate from the portion 6a of the sensor 12c. The signal generating device 6b could be located in or on the substrate 2 or in or on the integrated circuit chip 4 or be located in any location conforming to the electronic package design.

The warning signal, provided instantaneously by the signal generating device 6b, on receiving the electrical signal from the portion 6a of sensor 12c, reports a change in condition of the line 13. In another embodiment the warning signal emitted by the signal generating device 6b to the integrated circuit chip 4 may cause action of the integrated circuit chip 4 to determine the remaining service life of the substrate and its aforesaid associated electrical connections 8, 9 to the integrated circuit chip 4 and printed circuit board 5, respectively. In an embodiment a computing portion on the integrated circuit chip 4 may determine the remaining service life immediately after receiving the warning signal from the signal generating device 6b. Both the warning signal and the remaining service life may be transmitted to a monitoring entity, stored on the integrated circuit chip 4, or made to be displayed on a device connected to and external to the integrated circuit chip 4.

Figure 4:
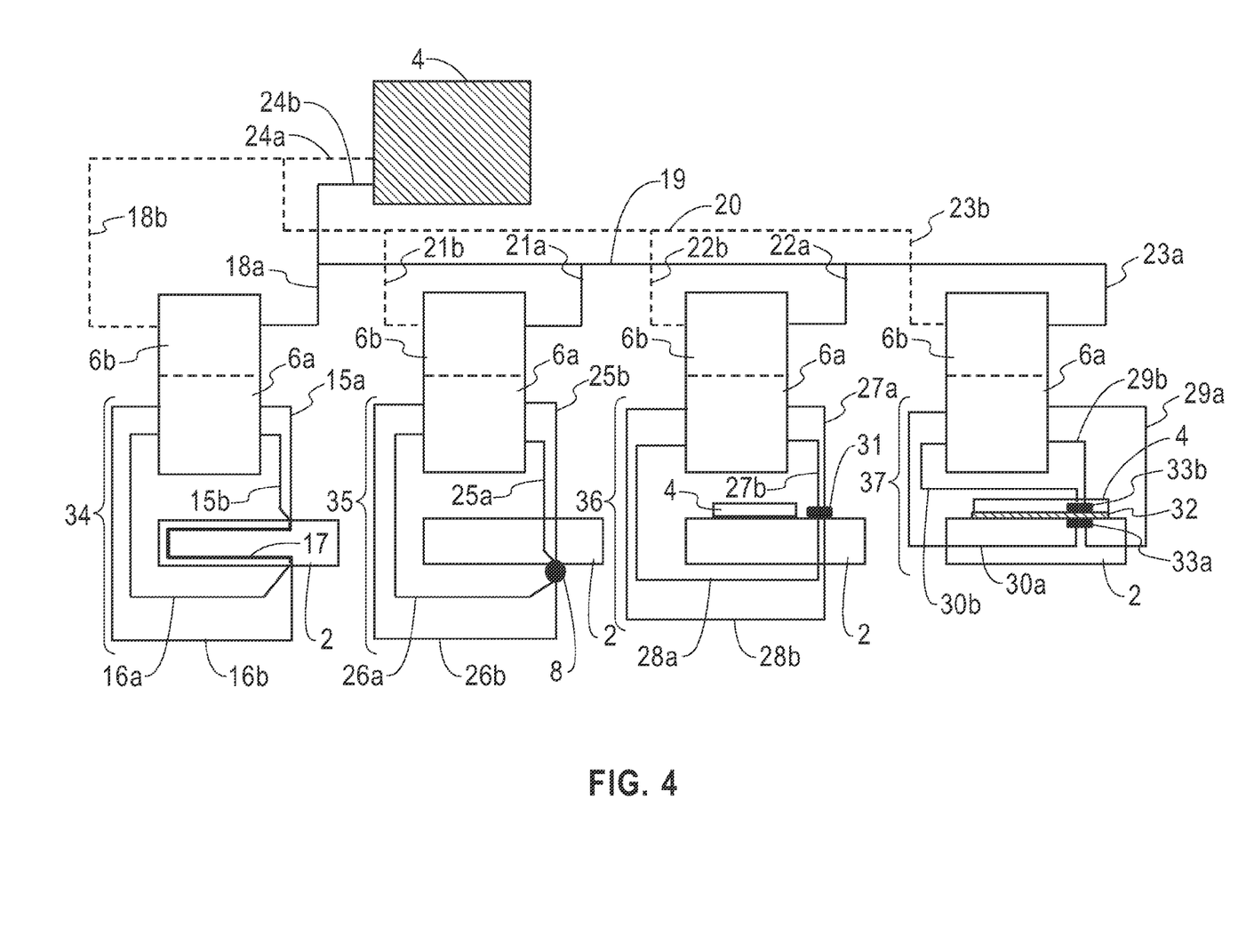
FIG. 4 is a schematic plan view of an apparatus in accordance with another embodiment of the invention, with a number of different types of sensors connected in parallel.

FIG. 4 depicts other possible conditions for which a warning signal can be provided. Detection and reporting of each condition associated with each specific electronic packaging structure is accomplished by a specific sensor (34, 35, 36, and 37). Many types of conditions can be detected which include electrical discontinuities, electrical shorting, flip chip failure, dimensional stability failure of the substrate, substrate to printed circuit board failure, delamination of the substrate failure, failure caused by TCE mismatches, thermal interfaces fails in thermal interface materials and power dissipation failures.

The first condition to be detected in FIG. 4 is one of an electrically conducting line 17 in the substrate 2. The sensor 34 is comprised of a portion 6a, a line 15a, a line 15b, return line 16 and a return line 16b. Lines 16a and 16b are connecting line 17 to the portion 6a. Any opens, shorts, near opens or near shorts in line 17 can be detected. Electrical continuity sensors of this type are widely available, for example, such sensors are available from:
1. Four-Point Probe, a division of Bridge Technology, whose website is sales@bridgetec.com, and also from,
2. CAPRES A/S, Copenhagen Applied Research with address, CAPRES A/S, DTU, bldg. 373, Diplomvej, 2800 Kgs. Lyngby, Denmark Phone: +45 45256700, Fax: +45 45256710.

Sensor 34 operates to generate an electrical signal upon detection of a condition of line continuity of the like. Note that a condition is any detectable change, transient or not transient, from normal operation voltage, current, temperature, temperature gradient, or any other measurable parameter. Portion 6a of sensor 34 sends the electrical signal to the signal generating device 6b, which then emits a warning signal. A line 18a from the signal generating device 6b to the integrated circuit chip 4 carries the warning signal, instantaneously alerting to the condition detected. The circuit line 18b from the integrated circuit chip 4 to the signal generating device 6b completes the circuit.

The second condition embodied in FIG. 4 detected by the sensor 35 operable to detect a failure in a solder connection (e.g., C4) 8, also known as a flip chip, connection. Fatigue failure in the connection 8 can result when there is a TCE mismatch of the integrated circuit chip 4 and the substrate 2. Strain in the connection 8 may results as the electronic package 1 is powered up and down leading to a difference of Temperature. An electrical change is detectable in the connection 8. Electrical opens due to cracks in the solder ball 8 or in the solder between the ball and the pad are conditions to be detected.

The rest of the circuits follow the same general details previously stated. Line 25a and line 25b, comprising the portion of the 4 point probe, connecting the output of the portion 6a of sensor 35 to the connection 8. Line 26a and line 26b are from the connection 8 to the portion 6a of the sensor 35. The portion 6a of sensor 35 sends an electrical signal, representing the condition of connection 8, to the signal generating device 6b. The signal generating device 6b then sends out a warning signal via 21a to the aforesaid integrated circuit chip 4 to warn of the condition of the C4. Line 21b completes the circuit from integrated circuit chip (4) back to the signal generating device 6b. In an another embodiment the signal generator 6b may sends the aforesaid warning signal to an external monitoring device such as a display, a recording device or receiver operable to receive electromagnetic waves.

Another embodiment is illustrated in sensor 36, operable to detect strain of substrate 2. Typically, a strain gauge measures strain in a material or body by detecting variation of an electrical property, resistance or voltage, proportional to the strain. A transducer converts strain into a detectable electrical change proportional to the strain imparted to the strain gauge by the substrate 2. Delamination, thermal deformations above and below the glass transition temperature of a laminate, strain induced by mismatches in the TCE of materials, are all examples of dimensional instabilities causing a strain gauge to produce a change in an electrical property detectable via sensor 36. The sensor 36 is operable to detect a change in an electrical property caused by strain. Embodied is portion 6a of sensor 36 comprising line 27a, 27b, a strain gauge 31, return line 28a and return line 28b. A change in an electrical property is detected in the strain gauge 31 as a function of strain in the substrate 2. An electrical signal is sent from the strain gauge 31 to the portion 6a of sensor 35 via lines 28a and 28b to signal the condition.

The portion 6a of sensor 36 sends an electrical signal to signal generating device 6b representing the condition. The signal generating device 6b sends out a warning signal. In FIG. 4 line 22a carries the warning signal to the aforesaid integrated circuit chip 4 to warn of the condition of the strain gauge 31. Line 22b completes the circuit from integrated circuit chip 4 to the signal generating device 6b. The signal generator 6b send out a warning signal or it may send the warning signal to the integrated circuit chip 4 for processing, transmission to an external monitoring entity, display and storing in computer memory.

The sensor 37 is operable to detect a change in an electrical property caused by a temperature differential change detected across a thermal interface material (TIM) 32. One thermocouple 33a is placed on one side of the thermal interface material (TIM) 32 and one thermocouple 33b is placed on the other side of the TIM 32. Typically these materials are filled polymers that soften at a given temperature to improve thermal conduction by flowing into small crevices created when two imperfectly flat surfaces are urged together. A thermal condition that degrades electronic package reliability can result if material does not fill in all the voids. In addition, voids are created over time that leads to over temperature conditions. Any number of conditions can signal a problem across these materials. Under chip encapsulant materials, filled polymer dispensed between C4 joints after chip join, may be assessed. In this embodiment one thermal couple 33b is in the integrated circuit chip 4 located just above the array of solder connections 8. The other thermocouple 33a is below the underfill material. In another embodiment, the thermocouple 33b is placed outside of the integrated circuit chip (4), on top of the substrate (2) surface. The second thermocouple 33a is embedded in the substrate just below the surface of the substrate (2), and just below the first thermocouple 33b. The placement allows the thermal differential of the surface of the substrate 2 compared to the bulk material of the substrate 4 to be measured. One skilled in the art would understand that placement of the thermocouple pair any where in or on the electronic package (1) would provide early, instantaneous data on a condition as it develops, during the life of the apparatus represented by substrate 2, chip 4, sensor 37, and signal generating device 6*b*.

Embodied in the detection of a thermal condition is a configuration where one line 29*a* from portion 6*a* of sensor 37 is connected from the portion 6*a* to the thermocouple 33*a* below the TIM 32 and another line 29*b*, out of the portion 6*a*, is connected to the thermocouple 33*b* situated over the TIM 32.

The portion 6*a* sends the electrical signal representing the thermal condition to the signal generating device 6*b*. The signal generating device 6*b* sends out a warning signal via line 23*a*, which latter becomes a line 19 connected to a line 24*b* to the aforesaid integrated circuit chip 4. A line 24*a* exits the integrated circuit chip 4 to connect to return line 18*b*, to a return line 21*b*, to another return line 22*b*, to finally to another return line 23*b*.

In all conditions detected, one skilled in the art would know that any one of the conditions detected could be wired in parallel or as a single stand alone sensor for detection and reporting a condition. Location of the sensor and signal generator could be anywhere to optimize the design of the electronic package.

Figure 5:
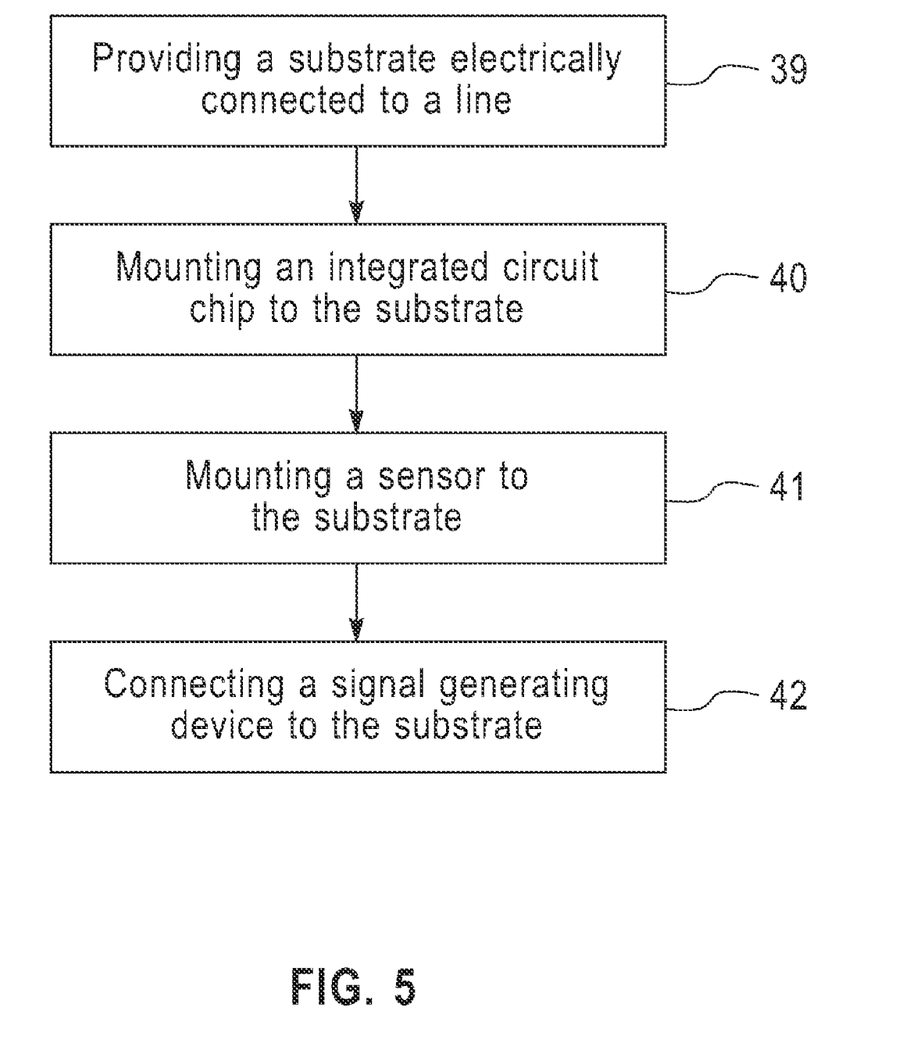
FIG. 5 is a flow chart depicting the basic steps of the method of the present invention.

The present invention provides a method for detecting and reporting a condition, comprising the steps of, a) providing a substrate that comprises an electrically conducting line 39, b) mounting an integrated circuit chip to the aforesaid substrate with electrical connection of the aforesaid integrated circuit chip to said line 40, c) mounting a sensor to the aforesaid substrate 41, the aforesaid sensor being operable to generate an electrical signal upon detection of a condition selected from a condition of the aforesaid substrate and a condition of an electrical connection to the aforesaid substrate, d) connecting a signal generator device to the aforesaid sensor 42, the aforesaid signal generating device being operable to receive the aforesaid electrical signal and, upon receipt thereof, operable to emit the aforesaid warning signal. The condition of the substrate and its connections is detected and reported via the conduction and propagation of electrical signals from the respective sensors, to the signal generating device whereby the signal generating device emits a warning signal or sends the warning signal to an integrated circuit chip for storage, for further processing or transmission out side of the electronic package to a display. One skilled in the art would know the warning signal may be conducted or transmitted wirelessly. One skilled in the art would know that the warning signal can, in addition to be immediately emitted by the signal generating device to a remote display, may also be stored on computer readable media for the purpose of providing a history.

A non limiting embodiment is if the substrate reaches above the glass transition temperature of the organic substrate, a critical temperature, the integrated circuit chip could store the thermal history.

Additionally, another non limiting embodiment could be that a look up table of critical threshold parameters is provided in order for a condition reported to be compared to the aforesaid critical threshold parameter, found in the look up table, for the purpose of taking action if a condition exceeds that specific critical threshold parameter. The glass transition temperature of an organic substrate may be a non limiting example of one such critical threshold parameter.

An addition embodiment is the use of predictive reliability models programmed onto computer readable media for the purpose of providing an instantaneous assessment of the remaining life of the substrate (2) and its associated connections 8, 9. This is initiated when the signal from the signal generating device 6*b* is received by the computing portion of an integrated circuit chip 4 on the substrate or off the substrate. The models are then used to calculate the aforesaid remaining lifetime. They include the Modified Coffin-Manson Fatigue Model for solder ball connections or any others used for electro migration, delamination. Models may be used alone or in combination. Actions to lower power consumption in certain electronic package circuits, swap out a module for a new module in a computer system, or shut down all or part of a computer system may be taken as a result of the remaining substrate life calculated and reported.

While the present invention has been described with reference to preferred embodiments in order to facilitate a better understanding of the invention, those skilled in the art will recognize that the invention can be embodied in various ways without departing from the scope and spirit of the invention as set fourth in the appended claims.

What is claimed is:

1. A method for detecting and reporting a condition, comprising the steps of;
   a) providing a substrate that comprises an electrically conducting line;
   b) mounting an integrated circuit chip to said substrate with electrical connection of said integrated circuit chip to said line;
   c) mounting a sensor to said substrate and in electrical connection with said integrated circuit chip, said sensor being operable to generate an electrical signal upon detection of a condition selected from a condition of said substrate and a condition of an electrical connection to said substrate, said condition is a result of the application of a stress selected from the group consisting of thermal and power cycling stress; connecting a signal generator device to said substrate, said signal generating device being operable to receive said electrical signal and upon receipt thereof, operable to emit a warning signal;
   whereby said warning signal is received by said integrated circuit chip as input to determine longevity of said substrate from predictive reliability models programmed onto a portion of said integrated circuit chip.

2. A method for detecting and reporting a condition, comprising the steps of;
   a) providing a substrate that comprises an electrically conducting line;
   b) mounting an integrated circuit chip to said substrate with electrical connection of said integrated circuit chip to said line;
   c) mounting a sensor to said substrate and in electrical connection with said integrated circuit chip, said sensor being operable to generate an electrical signal upon detection of a condition selected from a condition of said substrate and a condition of an electrical connection to said substrate, said condition is a result of the application of a stress selected from the group consisting of thermal and rower cycling stress;
   d) connecting a signal generator device to said substrate, said signal generating device being operable to receive said electrical signal and upon receipt thereof, operable to emit a warning signal;
   whereby said condition detected and reported is stored in a memory portion of said integrated circuit chip to provide a history of conditions of the substrate detected in the field over a time interval.

3. A method for detecting and reporting said substrate condition as in an one of claim 1 or claim 2, wherein said warning signal is sent by said signal generating device immediately upon receipt of said electrical signal by said signal generating device.

4. A method for detecting and reporting said condition as in any one of claim 1 or claim 2, wherein the emitting of said warning signal in step d) is carried out wirelessly.

5. A method for detecting and reporting a condition as in any one of claim 1 or claim 2, wherein any condition detected and reported is compared to a critical threshold parameter, comprising a programmable list of critical threshold parameters on computer readable media, for the purpose of taking action if said condition reported exceeds the programmed threshold corresponding critical parameter.

* * * * *